United States Patent [19]

Horsfall et al.

[11] Patent Number: 5,446,411
[45] Date of Patent: Aug. 29, 1995

[54] FREQUENCY TUNING FOR A PHASE LOCKED LOOP FM DEMODULATOR

[75] Inventors: Wayne L. Horsfall, Marlow, United Kingdom; Gary Shipton, St. Jean de Moirans, France

[73] Assignee: SGS-Thomson Microelectronics Limited, Marlow, United Kingdom

[21] Appl. No.: 176,342

[22] Filed: Dec. 30, 1993

[30] Foreign Application Priority Data

Sep. 29, 1993 [GB] United Kingdom ............... 9320069

[51] Int. Cl.⁶ .................... H03D 3/02; H03L 7/087
[52] U.S. Cl. ............................ 329/325; 331/11; 331/14; 331/16; 331/17; 331/25; 455/208; 455/260
[58] Field of Search ................ 331/10, 11, 14, 16, 331/17, 25; 329/325, 326; 455/208, 260

[56] References Cited

U.S. PATENT DOCUMENTS

| | | | |
|---|---|---|---|
| 3,611,175 | 10/1971 | Boelke | 331/4 |
| 4,167,711 | 9/1979 | Smoot | 331/8 |
| 4,365,211 | 12/1982 | Lee | 331/14 |
| 4,472,685 | 9/1984 | Dutasta | 329/325 |

FOREIGN PATENT DOCUMENTS 0360442  3/1990  European Pat. Off. .

Primary Examiner—Siegfried H. Grimm
Attorney, Agent, or Firm—Felsman, Bradley, Gunter & Dillon

[57] ABSTRACT

Apparatus for setting up the tuning frequency of a phase locked loop is provided which utilises the voltage controlled oscillator of the phase locked loop itself. The apparatus includes signal translation circuitry which can provide a control voltage to the VCO of the phase locked loop dependent on a tuning voltage which is alterable in response to the frequency of the signal output by the VCO.

13 Claims, 3 Drawing Sheets

/ 1

FREQUENCY TUNING FOR A PHASE LOCKED LOOP FM DEMODULATOR

FIELD OF THE INVENTION

The present invention relates to an apparatus and method for frequency tuning of a phase locked loop.

BACKGROUND TO THE INVENTION

In setting up the tuned frequency for operation of a phase locked loop, it would be desirable to avoid the need for a separate local oscillator to provide the comparison frequency for tuning.

SUMMARY OF THE INVENTION

According to one aspect of the present invention there is provided apparatus for setting up the tuning frequency of a phase locked loop including a voltage controlled oscillator, the apparatus including signal translation circuitry having a first input connected to receive a first voltage and a second input connected to receive a tuning voltage, the signal translation circuitry providing a control voltage to the voltage controlled oscillator which is dependent on the first voltage and the tuning voltage, and frequency detection circuitry for detecting the frequency of the signal output by the voltage controlled oscillator in response to said control voltage, whereby said tuning voltage is altered in response to the frequency detected by the frequency detection circuitry.

Preferably the tuning voltage is supplied through a switch which is disconnected when the correct tuning voltage has been established.

The frequency detection circuitry can comprise first and second current sources connected in series between respective voltage rails and an output node and being selectively switchable in response to a phase comparator connected to receive the signal output from the voltage controlled oscillator and a reference frequency signal. The output node supplies current which provides the tuning voltage via a capacitor. The capacitor maintains the tuning voltage on the second input of the signal translation circuitry when the switch has been disconnected.

During tuning, the first voltage can be a reference voltage set at a predetermined level. In normal operation of the phase locked loop, the first input can be connected to receive a voltage dependent on the phase difference between the output of the voltage controlled oscillator and a signal input to the phase locked loop. The signal translation circuit then provides to the voltage controlled oscillator a control voltage dependent on the voltage representative of the phase difference and on the preset tuning voltage.

Preferably, the signal translation circuit comprises a series resistance network having a resistance between the first input and the output providing the control voltage which is substantially greater than that between the output providing the control voltage and the second input.

The apparatus can include circuitry for preventing drift of the tuning voltage after disconnection from the signal translation circuit.

The invention also provides a method of tuning a phase locked loop to operate at a predetermined frequency, the phase locked loop including a voltage controlled oscillator and the method comprising supplying a tuning voltage to a signal translation circuit which provides a control voltage for the voltage controlled oscillator, detecting the frequency output from the voltage controlled oscillator and setting the tuning voltage at the predetermined frequency.

The method can include the step of providing a reference voltage to the signal translation circuit during tuning so that the control voltage is a function of the tuning voltage and the reference voltage. Preferably this function is determined by resistance values in a series resistance network.

An embodiment of the invention will now be described by way of example and with reference to the accompanying drawings in which:

BRIEF DESCRIPTION OF THE DRAWINGS

In the following figures, like numerals designate like parts.

DESCRIPTION OF THE PREFERRED EMBODIMENT

Figure 1:
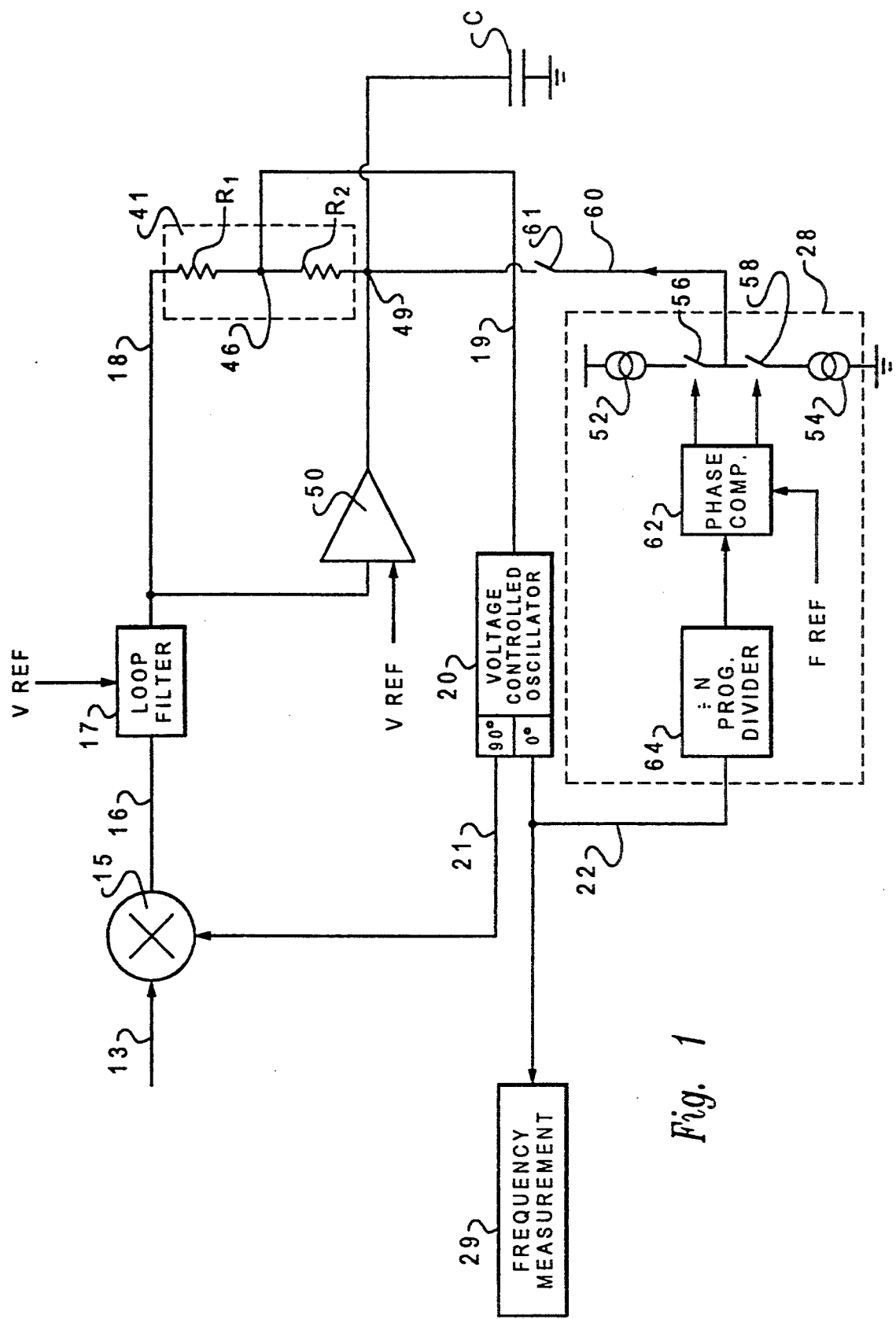
FIG. 1 is a schematic diagram of a phase locked loop with frequency set up circuitry.

FIG. 1 illustrates a phase locked loop which comprises a phase detector 15 having an output 16 connected to a loop filter 17 acting as a low pass filter. The output 18 of the filter 17 is supplied to a voltage divider circuit 41. The voltage divider circuit 41 comprises a first resistor R1 connected to a second resistor R2 at a voltage supply node 46. The voltage supply node 46 is connected to form a voltage input 19 to a voltage controlled oscillator 20. The voltage controlled oscillator 20 is arranged to provide two outputs 21 and 22 with a 90° phase separation between them. The output 21 forms a feedback input to the phase detector 15.

The phase locked loop can be set up to run at a predetermined frequency by the frequency synthesizer 28 shown in FIG. 1. The frequency synthesiser comprises opposed current sources 52,54 connected through respective switches 56,58 to supply current along line 60. The switches 56 and 58 are controlled by opposed outputs from a phase comparator 62 one input of which is provided by a programmable divider 64 and the other input of which receives a reference frequency FREF, for example derived from a crystal oscillator. The programmable divider has its input connected to the output 22 of the VCO 20, and operates to divide the output frequency of the VCO by a predetermined amount, dependent on the relationship between the reference frequency FREF and the derived tuning frequency. The output 22 of the VCO 20 is also supplied to a frequency measurement device 29. The current output on line 60 provides at node 49 a voltage for the voltage divider circuit 41 through the action of capacitor C. A switch 61 is connected in current supply line 60.

Reference numeral 50 denotes a voltage to current converter which has one input connected to receive the voltage on line 18 and the other input connected to receive a voltage reference Vref. This voltage to current converter 50 serves to maintain the voltage level on node 49 against drift when the switch 61 is disconnected.

In order to set up the phase locked loop to be tuned to a particular frequency, the desired divisor is set at the programmable divider 64. One of the current sources 52,54 is connected by the operation of one of the switches 56 and 58. Switch 61 is closed. With no input to the phase locked loop, the voltage on line 18 is at the DC level VREF. The control voltage supplied to the VCO 20 in line 19 is thus a function of the ratio between the resistors R1 and R2 and this value VREF. The resistors R1 and R2 are selected so that R1 is much greater than R2. This enables the VCO to respond to relatively large changes in voltage at node 49 during the frequency tuning stage. The voltage range might be, for example, 0 to 12 V. The output 22 of the VCO is fed back to the programmable divider 64. The phase comparator 62 compares the frequency output by the divider 64 with the reference frequency and alters the state of the switches 56 and 58 to decrease or increase the current on line 60 in dependence on the frequency difference detected. When the correct frequency has been established, switch 61 is opened and the voltage level maintained on node 49 by the action of the capacitor C. For phase locked loop tuning frequencies in the range of 5 to 10 MHz, a deviation of up to about 10 KHz is acceptable between the desired frequency and the frequency to which the phase locked loop is actually tuned.

In subsequent operation of the phase locked loop, after tuning, a signal is input on line 13 and the loop operates in a conventional manner. However, it is to be noted that the voltage divider circuit 41 has the effect of altering the control voltage supplied to the VCO 20 through the action of the resistance divider network R1,R2. Because R1 is much greater than R2, the effect is to reduce the gain of the VCO over a small range of voltages.

The voltage to current converter 50 receiving the voltage on line 18 and the reference voltage VREF acts through the capacitor C to maintain the voltage on line 49 at a stable level.

The arrangement of FIG. 1 allows a single VCO 20 forming part of a phase lock loop to be used not only in normal operation of that loop but also to set up the tuned frequency of the phase locked loop. This obviates the need for a separate local oscillator which would normally be required to set up the tuning frequency of a phase locked loop. Provided that the dividing ratio supplied by the voltage divider circuit 41 ($R2/_{R1+R2}$) is set to be much greater than one, the VCO 20 will appear to have a large dynamic range from the point of view of adjustment by the synthesiser 28 but nevertheless can operate over a smaller voltage range as seen within the phase locked loop. Thus, the effective slope for the VCO 20 when controlled by the synthesiser is S MHz/V (for example 1.75 MHz/V), while the effective slope for the VCO 20 when operating within the PLL is rS MHz/V. As an example, R1 = 16R2, r=1/$_{17}$.

The gain of the phase locked loop is affected by the resistance ratio in the resistance divider network R1,R2 and this thus must be carefully controlled to provide the necessary gain characteristics for the phase locked loop.

The circuit of FIG. 1 can be used to set up the tuning frequency for a phase locked loop in a variety of different circumstances. By way of example, there follows a description of two circuits which can be used to implement FM demodulation of a composite signal using a phase locked loop. In the following circuits, the circuit of FIG. 1 provides the additional advantages that the audio bias voltage can be maintained at VREF, typically 2.4 V, and that there is an increased audio level for the output audio signal. Typically, this could be 1 V peak to peak.

Figure 3:
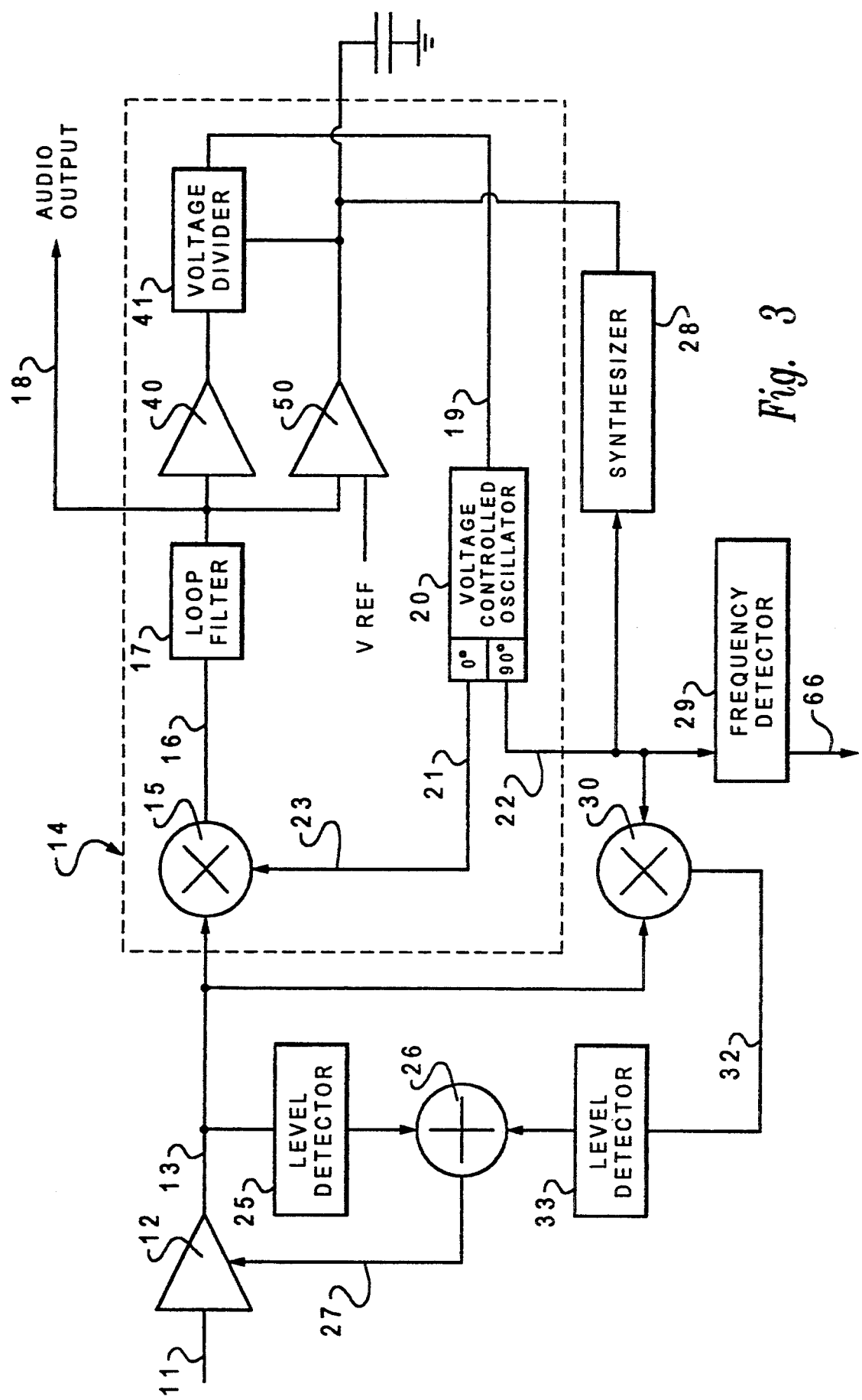
FIG. 3 shows a schematic diagram of a second embodiment of a phase locked loop in an FM sound carrier demodulating circuit.

In the discussion of FIG. 3 which follows, it will be appreciated that the calculations of R1 and R2 will be affected by the gain A provided in the programmable gain stage 40. The principles of operation of the circuit are nevertheless the same.

Figure 2:
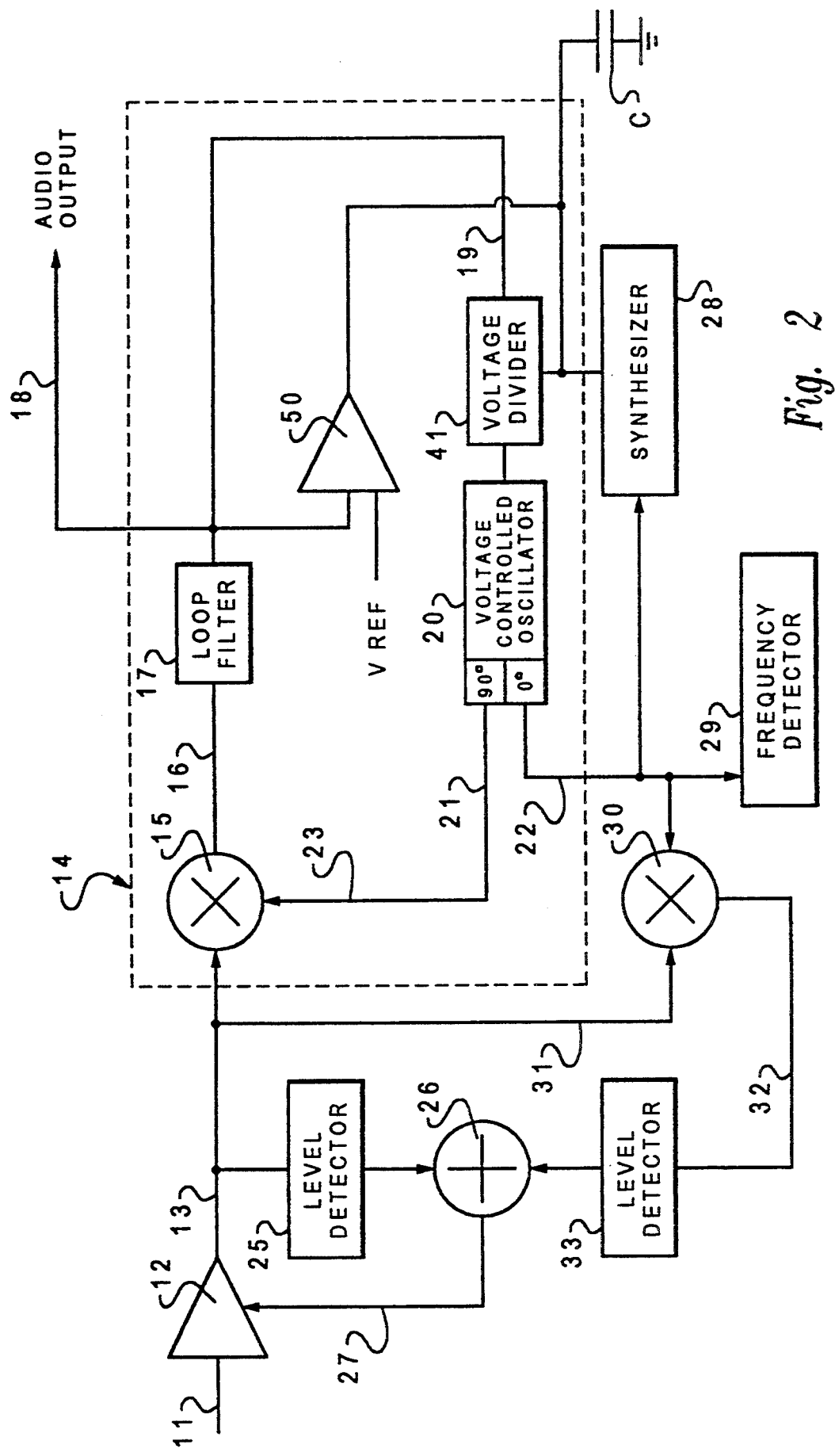
FIG. 2 shows a first embodiment of a phase locked loop in an FM sound carrier demodulating circuit.

In the example of FIG. 2 an input signal 11 comprises a plurality of FM sound carriers received by, for example, a satellite receiver each carrier being in the range of 5 MHz to 10 MHz with a modulation varying between ±50 KHz to ±200 KHz. Each of the carrier frequencies is separated from an adjacent carrier by more than 180 KHz and the modulation of each signal is arranged not to give a frequency overlap with the modulation of any adjacent carrier wave. The input signal 11 is fed to an automatic gain control circuit 12 having an output 13 forming an input to a phase locked loop circuit 14.

The phase locked loop includes a phase detector 15 having an output 16 connected to a loop filter 17 acting as a low pass filter arranged to pass audio signal, for example up to 20 KHz, without attenuation but with a sharp increase in attenuation at frequencies above this with particularly heavy attenuation of signals at 80 KHz. The output of the filter 17 forms an audio output 18 and is passed through a voltage divider circuit 41 to form a voltage input 19 to a voltage controlled oscillator 20. The voltage controlled oscillator 20 is arranged to provide two outputs 21 and 22 with a 90° phase separation between them. Output 21 forms a second input 23 to the phase detector 15. In known manner for using a phase locked loop for demodulation, the phase detector 15 provides an output 16 used to control the voltage controlled oscillator 20 via the loop filter 17 and circuit 41 so that the voltage controlled oscillator 20 tracks frequency variations in the input signal 13 to the phase locked loop. In tracking those frequency variations the variation in voltage on lines 18 and 19 represents the modulation and thereby the audio signal carried by the input carrier wave on line 13. In the present case the phase detector 15 is arranged to provide a current output signal which is converted to a voltage signal by the loop filter 17 and that voltage is used as an input to the voltage controlled oscillator 20. The phase detector 15 comprises a Gilbert multiplier circuit arranged to provide a current output having a magnitude representing the phase difference between the input signals 13 and 23 when they have the same frequency. When the input signals 13 and 23 have a different frequency the output of the phase detector 15 is a periodic output at the difference frequency.

It will be understood that the FM input signal 11 consists of a plurality of carrier waves of different frequencies and amplitudes. Prior to locking on, the output 13 of the gain control circuit 12 is supplied to a first level detector 25 which measures the peak amplitude of all carrier waves on line 13. This is fed through a summing circuit 26 to line 27 forming an input to the automatic gain control 12. In this way the gain effected by the gain control circuit 12 is dependent on the peak amplitude of the carrier waves on line 13. This puts the amplitude of the input signals forming an input to phase detector 15 within an amplitude range to which the detector can respond. The phase locked loop is tuned to a selected carrier frequency by use of the synthesiser 28 which provides a voltage input to the voltage controlled oscillator 20 through the voltage divider 41 to bring the output frequency of the oscillator to that of the required carrier frequency. The output 22 from the oscillator 20 is supplied to the synthesiser 28 so as to adjust the input voltage to the oscillator 20 until it is providing an output on lines 21 and 22 which is substantially equal to that of the carrier frequency to which the PLL is tuned. For the carrier wave frequencies mentioned above, up to about 10 KHz is an acceptable deviation. At this point the phase detector 15 will be receiving the tuned carrier frequency on input 23 and the composite carrier frequency signals on line 13. The phase locked loop 14 will act to lock onto the selected carrier frequency which is input on line 13. The phase detector 15 will compare the input 23 with all carrier frequencies arriving on the line 13 but in the case of all carrier frequencies other than the selected carrier frequency, the output on line 16 will have a high frequency representing the difference between the frequency of signal on line 23 and the various carrier frequencies. The low pass filter 17 will filter out all signals which result from comparison of input 23 with carrier frequencies other than the selected frequency. As the frequency of the selected carrier varies due to its modulation, the phase detector 15 will provide an output signal 16 which generates a voltage input at 19 to the voltage controlled oscillator 20 to make the voltage controlled oscillator track the modulation of the selected carrier wave. It is important that this tracking should be independent of the amplitude of the selected carrier wave.

For this reason the output 22 of the voltage controlled oscillator 20 is supplied to the further mixer circuit 30 which is of the same construction as the mixer 15. The mixer 30 has an input 31 derived from line 13 as well as the input derived from line 22 from the voltage controlled oscillator 20. Due to the 90° phase shift between lines 21 and 22 the mixer 15 will act as a phase detector for the selected carrier frequency and mixer 30 will act as an amplitude detector for the selected carrier frequency. In this way mixer 30 provides an output 32 which represents the amplitude of the selected carrier wave at any time and this is fed through a further level detector circuit 33 providing an input through unit 26 to line 27 and thereby control the automatic gain control unit 12. In this way, level detector 25 initially provides an untuned gain control which controls the operation of the automatic gain control circuit 12 setting a maximum level for the output signal 13. Once the phase locked loop 14 has locked onto the selected carrier frequency the signal derived from level detector 33 provides a tuned gain control which overrides control of the automatic gain control circuit 12 so as to control the signal level on line 13 to be constant amplitude at the tuned carrier frequency. The level detector 33 operates to vary the gain control 12 to signal levels below that initially set by level detector 25. In this way the input on line 13 to the phase detector 15 is made independent of the amplitude of the tuned carrier frequency. In this case the phase locked loop 14 is formed as a single integrated circuit on a single chip and the mixer 30 is formed on the same integrated circuit chip and has the same circuit design and made by the same process of manufacture so that the gain characteristics of mixer 30 are the same as those for mixer 15. In this way, the phase locked loop 14 automatically compensates for any amplitude variation of the carrier wave to which it is tuned.

The gain of the phase locked loop is carefully controlled so as to produce a stable loop producing rapid and stable lock onto the tuned frequency. This is achieved by setting the ratio in the voltage divider circuit. The operation of the circuit of FIG. 2 is discussed in more detail in our copending Application U.S. Ser. No. 175,785, filed Dec. 30, 1993 (Page White & Farrer Ref. 74182), herein incorporated by reference.

The circuit of FIG. 3 is similar to that of FIG. 1 except that it includes a programmable gain circuit 40 connected between the loop filter and the voltage divider circuit 41. The gain of the phase locked loop of FIG. 3 is carefully controlled by the circuit 40 so as to produce a stable loop producing rapid and stable lock onto the tuned frequency. The gain is such that the voltage controlled oscillator 20 provides a frequency variation on line 23 matching the required bandwidth of the carrier wave to which the PLL is tuned. By control of the bandwidth the lock range of the PLL circuit is controlled so as to avoid locking onto signals having bandwidths outside the desired lock range. Similarly the capture range of the circuit is determined by the time constant of the loop filter 17. This is arranged to limit the variation of input frequency from the tuned carrier frequency which can be captured by the PLL. As the gain of the phase detector 15 is dependent on the amplitude of the input signal on line 13 the stabilisation of amplitude which is achieved for the tuned carrier wave frequency results in a stabilised gain for that carrier frequency assisting in stable locking onto the required carrier frequency. In this way the control of the automatic gain control circuit 12 in dependence on the amplitude detected by the mixer 30 prevents a tendency for the loop to jump onto unwanted carrier frequencies.

The operation of the circuit of FIG. 3 is described more fully with reference to our copending Application U.S. Ser. No. 175,976, filed Dec. 30, 1993 (Page White & Farrer Ref. 74718), herein incorporated by reference.

What is claimed is:

1. Apparatus for setting up the tuning frequency of a phase locked loop including a voltage controlled oscillator, the apparatus comprising:

signal translation circuitry having a first input connected to receive a first voltage and a second input connected to receive a tuning voltage, the signal translation circuitry providing a control voltage to the voltage controlled oscillator which is dependent on the first voltage and the tuning voltage;

frequency detection circuitry for comparing a frequency of a first signal output by the voltage controlled oscillator in response to said control voltage with a reference frequency and generating an output, wherein said tuning voltage is altered in response to the output of the frequency detection circuitry;

a switch through which the tuning voltage is supplied and which is disconnected when the correct tuning voltage has been established; and a phase comparator connected to receive an FM modulated carrier wave as an input signal to the phase locked loop;

wherein the voltage controlled oscillator has a second output which is supplied to said phase comparator to provide a voltage dependent on the phase difference between the second output of the voltage controlled oscillator and the input signal to the phase locked loop, the signal translation circuit providing to the voltage controlled oscillator a control voltage dependent on the voltage representative of the phase difference add on the preset tuning voltage when said switch is disconnected wherein said first voltage represents a demodulated output derived from said FM modulated carrier wave.

2. Apparatus according to claim 1 wherein the frequency detection circuitry comprises first and second current sources connected in series between respective voltage rails and an output node and being selectively switchable in response to a phase comparator connected to receive the first signal output from the voltage controlled oscillator and the reference frequency signal.

3. Apparatus according to claim 2 wherein the output node supplies current which provides the tuning voltage via a capacitor, said capacitor maintaining the tuning voltage on the second input of the signal translation circuitry.

4. Apparatus according to claim 1 wherein, during tuning, the first voltage is a reference voltage set at a predetermined level.

5. Apparatus according to claim 1 wherein the signal translation circuit comprises a series resistance network having a resistance between the first input and the output providing the control voltage which is substantially greater than the resistance between the output providing the control voltage and the second input.

6. Apparatus according to claim 1 which includes circuitry for preventing drift of the tuning voltage after it has been set.

7. Apparatus for setting up the tuning frequency of a phase locked loop including a voltage controlled oscillator, the apparatus comprising:
signal translation circuitry having a first input connected to receive a first voltage and a second input connected to receive a tuning voltage, the signal translation circuitry providing a control voltage to the voltage controlled oscillator which is dependent on the first voltage and the tuning voltage;
frequency detection circuitry for detecting a frequency of a first signal output by the voltage controlled oscillator in response to said control voltage, wherein said tuning voltage is altered in response to the frequency detected by the frequency detection circuitry;
a phase comparator connected to receive an FM modulated carrier wave as an input signal to the phase locked loop;
wherein the voltage controlled oscillator has a further output which is supplied to said phase comparator to provide a voltage dependent on the phase difference between the further output of the voltage controlled oscillator and the input signal to the phase locked loop, the signal translation circuit providing to the voltage controlled oscillator a control voltage dependent on the voltage representative of the phase difference and on the preset tuning voltage;
wherein the frequency detection circuitry comprises first and second current sources connected in series between respective voltage rails and an output node and being selectively switchable in response to a phase comparator connected to receive the signal output from the voltage controlled oscillator and a reference frequency signal, said frequency detection circuit being selectively disconnected from said second input when the correct tuning voltage has been established.

8. A method of operating a phase locked loop to provide a demodulated output derived from an FM modulated carrier wave provided as an input to the phase locked loop, the phase locked loop including a voltage controlled oscillator and the method comprising the steps of:
(i) tuning the phase locked loop to operate at a predetermined frequency by supplying a tuning voltage to a signal translation circuit which provides a control voltage for the voltage controlled oscillator, detecting the frequency output from the voltage controlled oscillator and setting the tuning voltage at the predetermined frequency; and
(ii) after setting the tuning voltage, using the voltage controlled oscillator to provide an output to a phase comparator of the phase locked loop, said phase comparator providing a voltage dependent on the phase difference between the output of the voltage controlled oscillator and the FM modulated carrier wave to generate said demodulated output.

9. A method according to claim 8 which includes the step of providing a reference voltage to the signal translation circuit during said tuning step so that the control voltage is a function of the tuning voltage and the reference voltage.

10. A method of operating a phase locked loop according to claim 8 wherein the step of detecting the frequency output from the voltage controlled oscillator comprises selectively switching first and second current sources connected in series between respective voltage rails and an output node in response to a phase comparator connected to receive the frequency output from the voltage controlled oscillator and a reference frequency.

11. A method of operating a phase locked loop according to claim 8 wherein the step of setting the tuning voltage comprises applying a correct tuning voltage to the signal translation circuit from a frequency detection circuit and then disconnecting the frequency detection circuit from the signal translation circuit.

12. A method of operating a phase locked loop according to claim 8 wherein the FM modulated carrier wave is modulated by an audio signal.

13. A method of operating a phase locked loop according to claim 8 wherein a plurality of FM modulated carrier waves of different frequencies and amplitudes are provided as an input to the phase locked loop and wherein the phase locked loop is tuned to one of said frequencies by said tuning step.

* * * * *